United States Patent
Tuntasood (12)

(10) Patent No.: US 6,171,907 B1
(45) Date of Patent: *Jan. 9, 2001

(54) METHOD FOR FABRICATING TUNNEL WINDOW IN EEPROM CELL WITH REDUCED CELL PITCH

(75) Inventor: Prateep Tuntasood, San Jose, CA (US)

(73) Assignee: Nexflash Technologies, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/994,101

(22) Filed: Dec. 19, 1997

(51) Int. Cl.$^7$ ............... H01L 21/336; H01L 21/8238; H01L 29/788
(52) U.S. Cl. ............... 438/264; 438/211; 438/257; 257/321
(58) Field of Search ............... 438/211, 257, 438/258, 279, 264; 257/321

(56) References Cited

U.S. PATENT DOCUMENTS 4,701,776  10/1987  Perlegos et al. ............... 357/23.5
5,273,923 * 12/1993  Chang et al. ............... 437/43

FOREIGN PATENT DOCUMENTS 5-055597 * 3/1993 (JP) .

* cited by examiner

*Primary Examiner*—Wael Fahmy
*Assistant Examiner*—Neal Berezny
(74) *Attorney, Agent, or Firm*—Pennie & Edmonds LLP (57) ABSTRACT

A method for fabricating a tunnel window in an EEPROM cell that reduces or eliminates the initial active region overlap yet still compensates for tunnel window misalignment. The inventive method accomplishes this by removing a portion of the field oxide layer surrounding an initial active region before depositing the BN+ diffusion layer. This step is performed in order to enlarge the area in which the BN+ diffusion layer is formed to beyond the perimeter of the tunnel window forming a final active region. As a result, the method of the present invention ensures that the tunnel window is fully enclosed by the BN+ diffusion layer despite any tunnel window misalignment that may occur. Reducing the initial active region creates an EEPROM cell with a reduced cell pitch while increasing its coupling ratio.

3 Claims, 6 Drawing Sheets

METHOD FOR FABRICATING TUNNEL WINDOW IN EEPROM CELL WITH REDUCED CELL PITCH

The present invention relates generally to methods for fabricating nonvolatile semiconductor memory devices, and more particularly to a method for fabricating a tunnel window in an electrically-erasable-programmable read-only memory (EEPROM) cell with a reduced cell pitch.

BACKGROUND OF THE INVENTION

Electrically-erasable-programmable read-only memory (EEPROM) devices are well-known in the art. EEPROMs are a type of nonvolatile memory, a category that also includes erasable-programmable read-only memories (EPROMs) and flash memories.

EEPROMs include an array consisting of EEPROM cells arranged in rows and columns. Each row of EEPROM cells in the array is connected to a respective word line WL. Each column of EEPROM cells in the array is connected to one, or a pair of, bit lines BL.

EEPROMs support three basic operations: read, program and erase. The read operation reads the data stored in selected cells in the EEPROM. The program operation writes data to selected EEPROM cells. The erase operation erases data globally or from selected sectors of the EEPROM.

Figure 1:
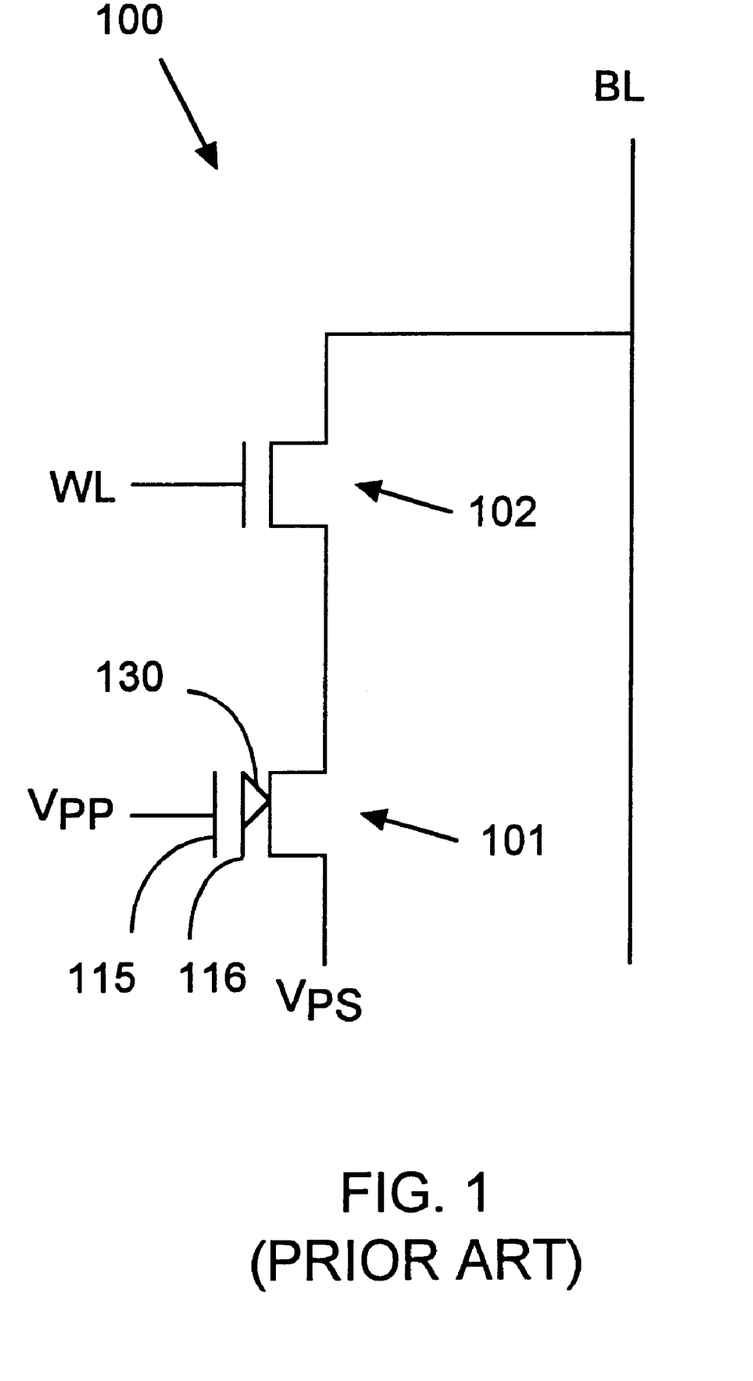
FIG. 1 is a circuit diagram for an EEPROM cell characteristic of both the prior art and the present invention.

FIG. 1 is a circuit diagram for a typical EEPROM cell 100. EEPROM cell 100 comprises two n-channel metal-oxide semiconductor (NMOS) transistors: memory transistor 101 and select transistor 102. Memory transistor 101 stores the binary state of EEPROM cell 100, which can be either a "0" or a "1". Memory transistor 101 is a specially constructed transistor that includes two gates: a control gate 115 and a floating gate 116. Control gate 115 is connected to a $V_{PP}$ signal which is set to various different voltages during read, program and erase operations. Floating gate 116, which is electrically insulated from the rest of EEPROM cell 100, stores a charge representing the binary state of the EEPROM cell.

Also referring to FIG. 1, memory transistor 101 additionally includes a tunnel window 130. Tunnel window 130 is used to transfer charge between the drain and floating gate 116 of memory transistor 101 during a program or erase operation. The tunnel window encloses a very thin tunnel oxide layer sandwiched between floating gate 116 and the drain of memory transistor 101 through which electrons may tunnel.

Continuing to refer to FIG. 1, memory transistor 101 of EEPROM cell 100 further includes a source and a drain. The source of memory transistor 101 is connected to a $V_{PS}$ signal which assumes one of several different states or voltages during read, program and erase operations. The drain of memory transistor 101 is connected to the source of select transistor 102.

Still referring to FIG. 1, select transistor 102 of EEPROM cell 100 couples memory transistor 101 to a bit line BL corresponding to the EEPROM cell. Select transistor 102 is a conventional transistor including a gate, a source and a drain. The gate of select transistor 102 is connected to a word line WL corresponding to the EEPROM cell. The drain of the select transistor is connected to the bit line BL. The source of the select transistor is connected to the drain of memory transistor 101.

Figure 2:
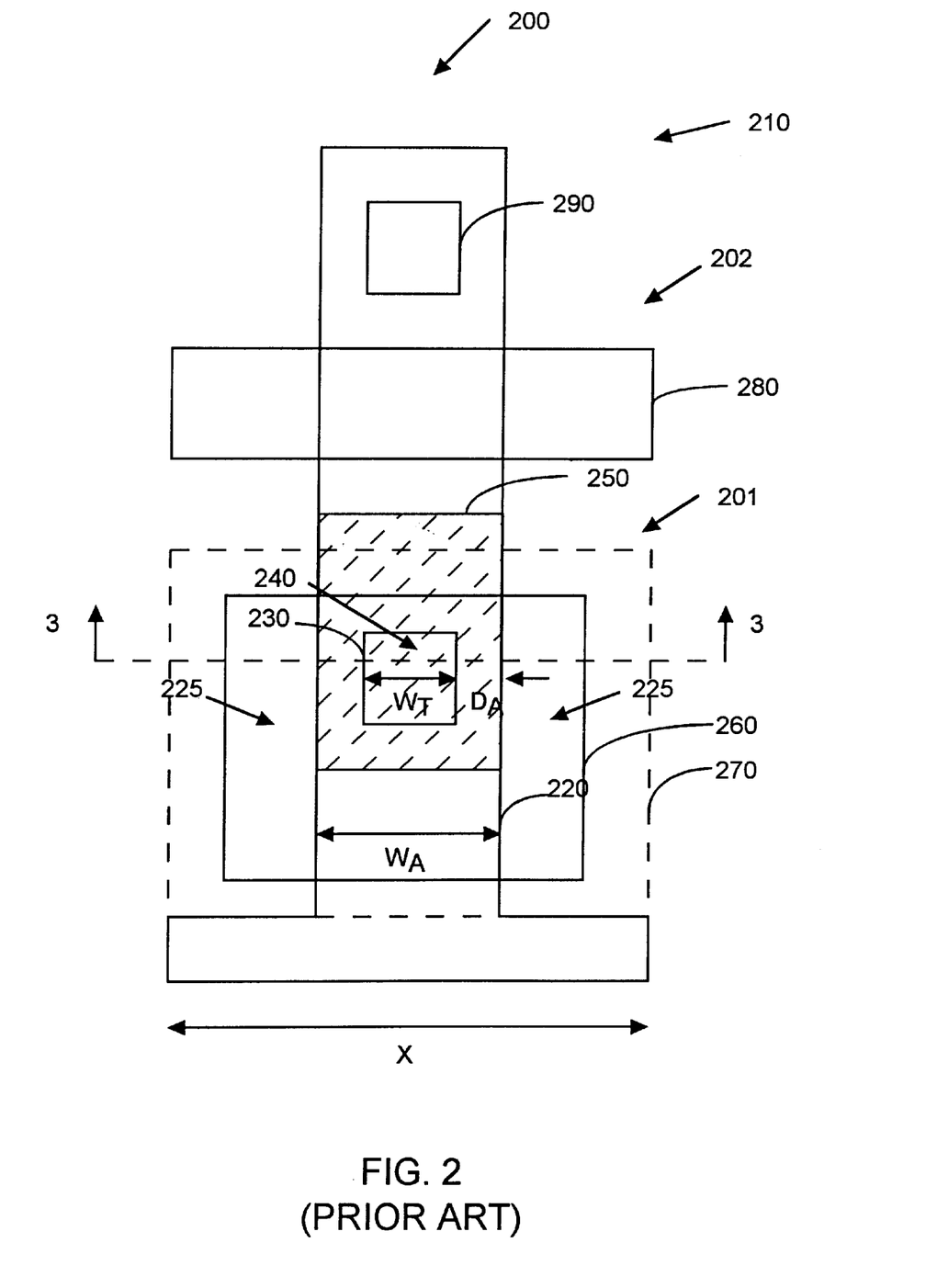
FIG. 2 is a plan view of a conventional EEPROM cell.
Figure 3:
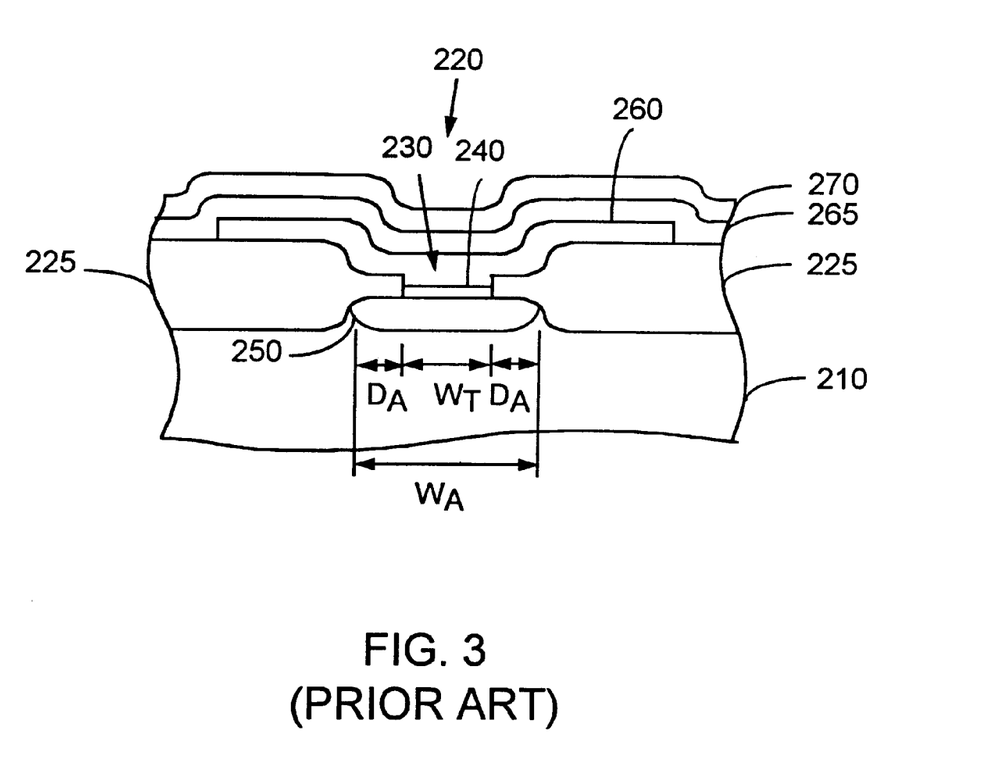
FIG. 3 is a cross-sectional view of the EEPROM cell shown in FIG. 2 along the lines 3—3.

FIGS. 2 and 3 illustrate a conventional physical structure for an EEPROM cell 200. FIG. 2 is a plan view of the physical structure, while FIG. 3 is a cross-sectional view along the lines 3—3 shown in FIG. 2.

Referring to FIGS. 2 and 3, EEPROM cell 200 includes a memory transistor 201 and a select transistor 202. Memory transistor 201 includes a tunnel window 230 over a buried N+ diffusion region of the memory transistor. Tunnel window 230 has a width of $W_T$. As mentioned earlier, tunnel window 230 encloses a tunnel oxide layer 240 through which electrons tunnel during an EEPROM cell program or erase operation. Continuing to refer to FIGS. 2 and 3, EEPROM cell 200 also includes an active region 220 of width $W_A$ that intersects tunnel window 230. Active region 220 includes the source, drain, and channel regions of memory transistor 201 and select transistor 202. EEPROM cell 200 further includes a field oxide layer 225 adjacent to and surrounding active region 220.

Still referring to FIGS. 2 and 3, EEPROM cell 200 additionally includes a buried N+ diffusion (BN+) layer 250 in p-type substrate 210. BN+ diffusion layer 250 is located underneath and extends beyond the perimeter of tunnel window 230.

Further referring to FIGS. 2 and 3, EEPROM cell 200 also includes a first-level polysilicon (poly1) layer 260, an oxide-nitride-oxide (ONO) layer 265 and a second-level polysilicon (poly2) layer 270 over tunnel window 230. Poly1 layer 260 and poly2 layer 270 form the floating gate and control gate, respectively, of memory transistor 201.

Referring to FIG. 2, EEPROM cell 200 also includes a polysilicon layer 280 crossing over active region 220. Polysilicon layer 280 forms the gate of select transistor 202. EEPROM cell 200 further includes a contact 290. Contact 290 connects the drain of select transistor 202 to the respective bit line BL (not shown) for EEPROM cell 200.

For EEPROM cell 200 to function properly, tunnel window 230 must be fully enclosed by BN+ diffusion layer 250. However, processes for fabricating EEPROM cell 200 may misalign tunnel window 230 with respect to BN+ diffusion layer 250 such that the tunnel window contacts substrate 210. If tunnel window 230 contacts substrate 210, a leakage current will occur at the junction formed between BN+ diffusion layer 250 and p-type substrate 210 whenever a program operation is performed. This leakage current reduces the breakdown voltage of the junction, thereby limiting the maximum voltage that can be formed at the drain of memory transistor 201. As a result, the tunnel window misalignment increases the time required to program EEPROM cell 200 or worse, prevents the cell from being programmed.

Continuing to refer to FIGS. 2 and 3, conventional EEPROM cell 200 ensures that BN+ diffusion layer 250 fully encloses tunnel window 230 despite any misalignment by providing active region 220 with a width $W_A$ that extends beyond the tunnel window by an overlap $D_A$. The width $W_A$ of active region 220 is thus $W_T+2D_A$, where $W_T$ is the width of tunnel window 230 and $D_A$ is the active region overlap.

Widening active region 220 ensures that BN+ diffusion layer 250 fully encloses tunnel window 230 because the width of BN+ diffusion layer 250 generally coincides with the width $W_A$ of active region 220, as will now be explained. BN+ diffusion layer 250 is formed by performing an N+ ion implantation of substrate 210 that is exposed in active region 220 but covered elsewhere with a field oxide layer 225. The ions penetrate the exposed substrate 210 in active region 220 but are stopped by the relatively thick field oxide layer 225. As a result, BN+ diffusion layer 250 coincides with active region 220 and extends beyond tunnel window 230 by the overlap $D_A$. Therefore, the active region overlap $D_A$ ensures that the tunnel window is fully enclosed by the BN+ diffusion layer despite any tunnel window misalignment that may occur.

For example, a typical fabrication process for EEPROM cell 200 may have an alignment tolerance for tunnel window 230 of 0.15 micrometers ($\mu$m), i.e., tunnel window 230 may be misaligned with respect to BN+ diffusion layer 250 by as much as 0.15 $\mu$m. In this case, an active region overlap $D_A$ of about 0.2 $\mu$m ensures that tunnel window 230 will be fully enclosed by BN+ diffusion layer 250.

However, providing active region 220 with active region overlap $D_A$ increases the active region width $W_A$, which has two important negative consequences for conventional EEPROM cell 200. First, the increased active region width increases the pitch of EEPROM cell 200 by a corresponding amount. As a result, the area of the EEPROM cell is increased. Second, the increased active region width reduces the coupling ratio of EEPROM cell 200. This is because the coupling ratio of the EEPROM cell is inversely related to the size of the overlap area between active region 220 and poly1 layer 260. A lower coupling ratio reduces the threshold voltage margin between the "0" and "1" states of the EEPROM cell. As a result, the EEPROM cell is more likely to experience read errors.

In view of the shortcomings of the prior art, it is an object of the present invention to provide a method for fabricating a tunnel window in an EEPROM cell that reduces the active region overlap yet still compensates for tunnel window misalignment.

SUMMARY OF THE INVENTION

The present invention is a method for fabricating a tunnel window in an EEPROM cell that reduces cell pitch while still compensating for tunnel window misalignment. The inventive method accomplishes this by removing a portion of the field oxide layer surrounding the initial active region before depositing the BN+ diffusion layer. This step is performed in order to enlarge the area in which the BN+ diffusion layer is formed to beyond the perimeter of the tunnel window forming the final active region. As a result, the method of the present invention ensures that the tunnel window is fully enclosed by the BN+ diffusion layer despite any tunnel window misalignment that may occur. Even though the final active region is roughly the same size as the active region defined in the prior art, the cell pitch is reduced because the width of the floating gate poly layer is defined by the initial active region.

The method of the present invention comprises the following steps: (1) providing a substrate, (2) defining an initial active region in the substrate, (3) forming a field oxide layer over the substrate in a field region of the substrate adjacent to and surrounding the initial active region, (4) removing a portion of the field oxide layer from a buried diffusion region of the substrate, (5) forming a buried diffusion layer in the substrate in the buried diffusion region, (6) forming an oxide layer over the substrate in the buried diffusion region, (7) removing a portion of the oxide layer from a tunnel window region of the substrate to form a tunnel window, wherein the tunnel window region is enclosed by and is smaller than the buried diffusion region, and (8) forming a tunnel oxide layer over the substrate in the tunnel window region.

BRIEF DESCRIPTION OF THE DRAWINGS

Additional objects and features of the present invention will be more readily apparent from the following detailed description and appended claims when taken in conjunction with the drawings, in which:

DESCRIPTION OF THE PREFERRED EMBODIMENT

Figure 4:
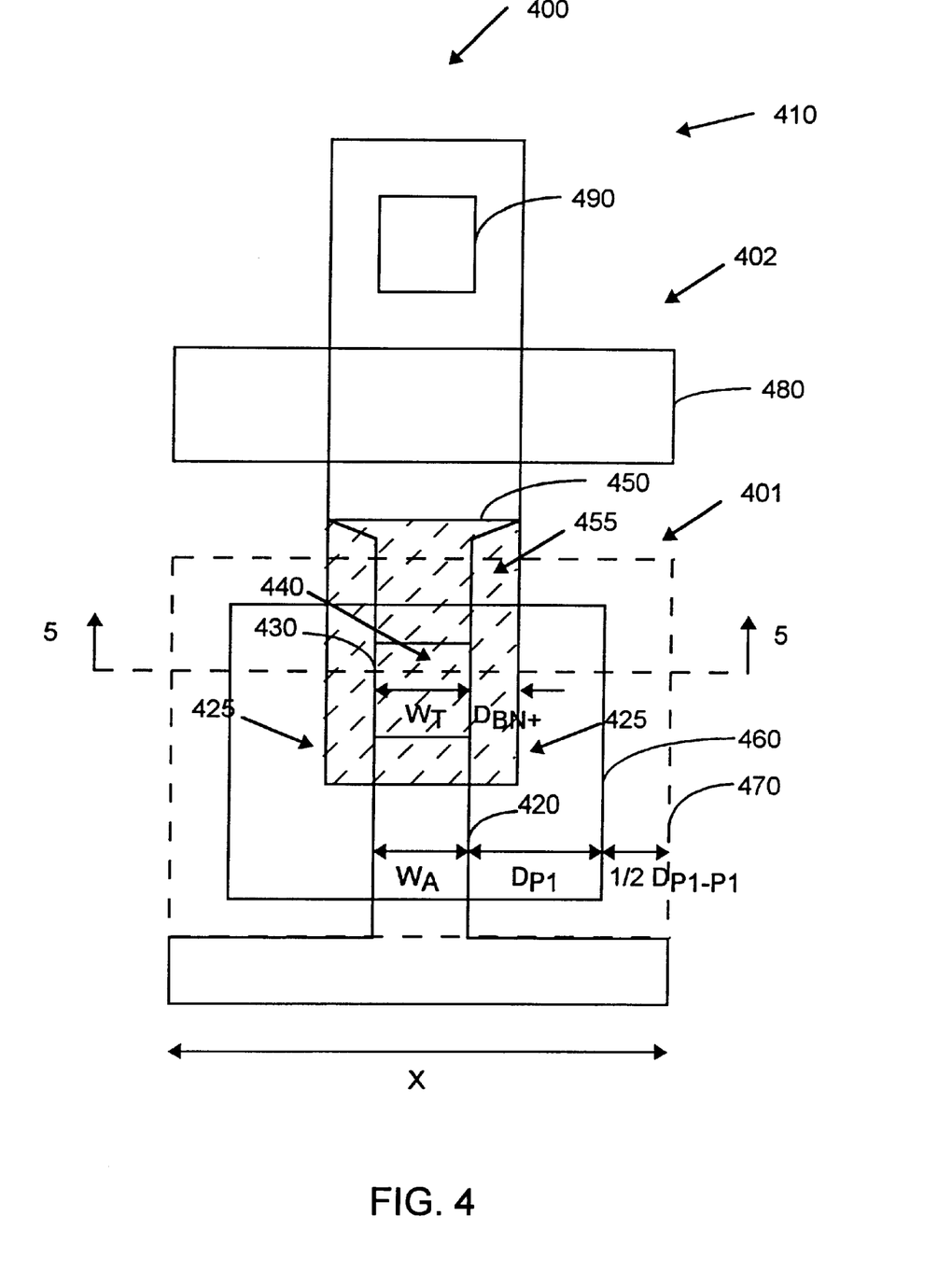
FIG. 4 is a plan view of an EEPROM cell in accordance with an embodiment of the present invention.

FIG. 4 is a plan view of an EEPROM cell 400 in accordance with an embodiment of the present invention. EEPROM cell 400 is similar in many respects to the EEPROM cell described in the background section and therefore, only aspects of the EEPROM cell particularly pertinent to the present invention will be described herein.

Referring to FIG. 4, EEPROM cell 400 includes a memory transistor 401 and a select transistor 402. Memory transistor 401 includes a tunnel window 430 having a width $W_T$. As mentioned above in the background section, the tunnel window is used to transfer charge between the drain and the floating gate of memory transistor 401 during a program or erase operation. Tunnel window 430 encloses a tunnel oxide layer 440 through which the charge transfer occurs via electron tunneling.

Continuing to refer to FIG. 4, EEPROM cell 400 also includes an initial active region 420 that intersects tunnel window 430. Initial active region 420 includes the source, drain, and channel regions of memory transistor 401 and select transistor 402.

Initial active region 420 has a width $W_A$ that varies across its length. For the portion of active region 440 that intersects tunnel window 430, the initial active region width $W_A$ is the same as the tunnel window width $W_T$. Therefore, unlike the conventional EEPROM cell 200 described above in the background section, there is no overlap $D_A$ of initial active region 420 over tunnel window 430.

Continuing to refer to FIG. 4, EEPROM cell 400 additionally includes a buried N+ diffusion (BN+) layer 450 in substrate 410. BN+ diffusion layer 450 is located underneath and extends beyond the perimeter of tunnel window 430 by an overlap $D_{BN+}$. The BN+ diffusion layer combined with the initial active region form the final active region of width $W_A+2D_{BN+}$. As will be described in greater detail below, the BN+ diffusion layer overlap $D_{BN+}$ is provided to ensure that tunnel window 430 is fully enclosed by BN+ diffusion layer 450 despite any tunnel window misalignment that may occur during the fabrication of EEPROM cell 400. In one embodiment of the present invention, overlap $D_{BN+}$ is about 0.2 $\mu$m, which is adequate for a fabrication process having a tunnel window alignment tolerance of 0.15 $\mu$m.

Still referring to FIG. 4, EEPROM cell 400 also includes a first-level polysilicon (poly1) layer 460 and a second-level polysilicon (poly2) layer 470 over tunnel window 430. Poly1 layer 460 and poly2 layer 470 form the floating gate and control gate, respectively, of memory transistor 401.

Further referring to FIG. 4, EEPROM cell 400 also includes a polysilicon layer 480 crossing over the active region. Polysilicon layer 480 forms the gate of select transistor 402. EEPROM cell 400 further includes a contact 490.

Contact 490 connects the drain of select transistor 402 to the respective bit line BL (not shown) for EEPROM cell 400.

The reduction or elimination of the overlap $D_A$ of initial active region 420 over tunnel window 430 reduces the pitch X of EEPROM cell 400, as will now be explained. The pitch X of EEPROM cell 400 is defined by the equation:

$$X = W_A + 2D_{P1} + D_{P1-P1},$$

where $W_A$ is the width of initial active region 420, $D_{P1}$ is the overlap dimension requirement of poly1 layer 460 over initial active region 420 and $D_{P1-P1}$ is the spacing dimension requirement between two adjacent poly1 regions 460. The dimensions $D_{P1}$ and $D_{P1-P1}$ are specified by the process technology used to fabricate EEPROM cell 400. Because the overlap $D_A$ of initial active region 420 over tunnel window 430 is eliminated in EEPROM cell 400, the initial active region width $W_A$ is reduced from $W_T + 2D_A$ (for conventional EEPROM cell 200 as described above in the background section) to $W_T$. The dimensions $D_{P1}$ and $D_{P1-P1}$ remain constant since they are specified by the process technology. Therefore, it can be seen from the equation that eliminating the active region overlap $D_A$ in EEPROM cell 400 reduces the EEPROM cell pitch X by $2D_A$. As a result, the area of EEPROM cell 400 is smaller than that of conventional EEPROM cell 200.

In the conventional EEPROM cell 200 described in the background section above, pitch X is about 2.3 $\mu$m and active region overlap $D_A$ is about 0.2 $\mu$m when using a fabrication process with a 0.5 $\mu$m minimum dimension. By eliminating active region overlap $D_A$, the pitch X of EEPROM cell 400 is reduced to about 1.9 $\mu$m, a reduction of about 10 to 20 percent.

In addition to reducing its size, the reduction or elimination of active region overlap $D_A$ increases the coupling ratio of the EEPROM cell. This is because the coupling ratio of EEPROM cell 400 is inversely proportional to the size of the overlap area between active region 420 and poly1 layer 460. A higher coupling ratio increases the threshold voltage margin between the "0" and "1" states of the EEPROM cell. As a result, the EEPROM cell is less subject to read errors.

FIGS. 5(a) to 5(e) illustrate the fabrication process for EEPROM cell 400. The figures show a cross-sectional view of EEPROM cell 400 along the lines 5—5 shown in FIG. 4, i.e., the region surrounding tunnel window 430. The processes used to perform each individual fabrication step are well-known in the art and therefore will only be briefly described herein.

Figure 5A:
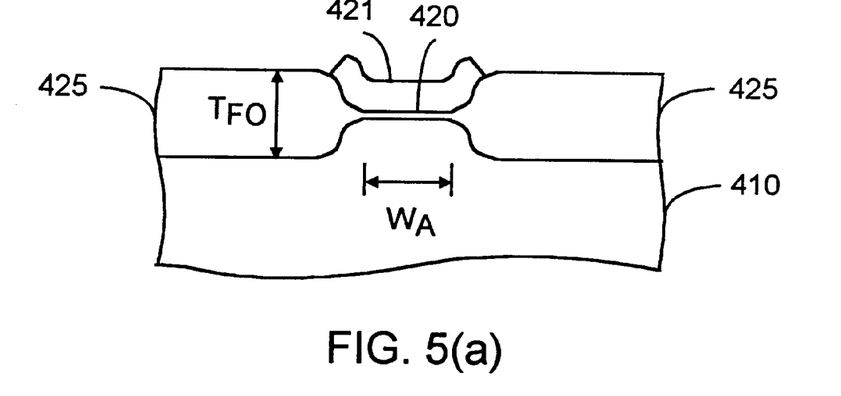
FIGS. 5(a)–5(e) are cross-sectional views of the EEPROM cell shown in FIG. 4 along the lines 5—5 at several stages of the fabrication process for the cell.

First, referring to FIG. 5(a), an active region mask 421 is placed on substrate 410 to define an initial active region 420 of width $W_A$ of EEPROM cell 400. FIG. 4 shows a plan view of initial active region 420. As mentioned earlier, the initial active region width $W_A$ is the same as the width $W_T$ of the subsequently formed tunnel window 430.

Next, also referring to FIG. 5(a), a field oxide layer 425 is formed over substrate 410 in a field region of the substrate. The field region is adjacent to and surrounds the final active region. FIG. 4 shows a plan view of field oxide layer 425. In one embodiment of the present invention, field oxide layer 425 is composed of silicon dioxide (SiO$_2$) and has a thickness $T_{FO}$ of about 2000 to 3000 Å. In this embodiment, field oxide layer 425 is formed using thermal oxidation. After field oxide layer 425 is formed, active region mask 421 is removed from the substrate.

Figure 5B:
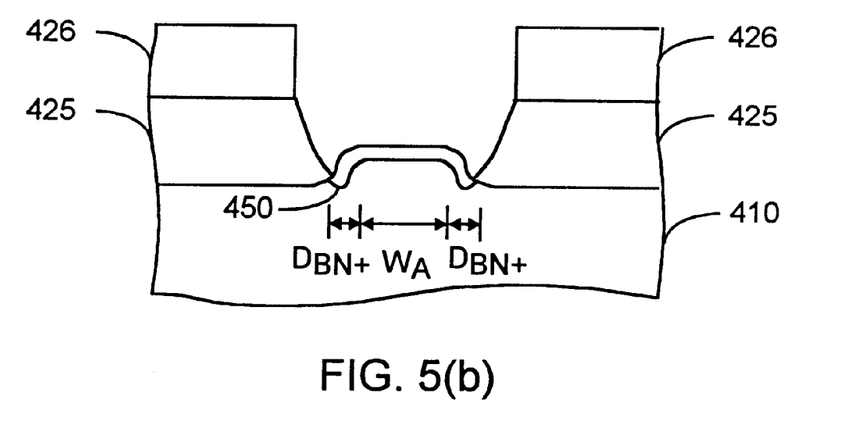

Referring to FIG. 5(b), a portion of field oxide layer 425 is then removed from a buried diffusion region of the substrate 410 to expose a portion of the substrate. FIG. 4 shows a plan view of the buried diffusion region from which field oxide layer 425 is removed, indicated as BN+ diffusion layer 450. Referring to FIGS. 4 and 5(b), the buried diffusion region surrounds and extends beyond the width $W_T$ of the subsequently formed tunnel window 430 and extends beyond the initial active region 420 by the overlap $D_{BN+}$ to form the final active region. As will be explained in greater detail below, the overlap $D_{BN+}$ is provided to ensure that, in subsequent process steps, tunnel window 430 will be fully enclosed by BN+ diffusion layer 450. In one embodiment of the present invention, field oxide layer 425 is removed by performing an isotropic wet etch of substrate 410 through a BN+ mask 426.

Next, still referring to FIG. 5(b), a buried N+ diffusion (BN+) layer 450 is formed in substrate 410 in the buried diffusion region of the substrate. FIG. 4 shows a plan view of BN+ diffusion layer 450. In one embodiment of the present invention, BN+ diffusion layer 450 is formed by performing an N+ ion implantation into substrate 410 through BN+ mask 426. The ions penetrate the exposed portion of substrate 410 in the buried diffusion region but are stopped by BN+ mask 426 and field oxide layer 425. As a result, BN+ diffusion layer 450 coincides with the exposed portion of substrate 410.

Figure 5C:
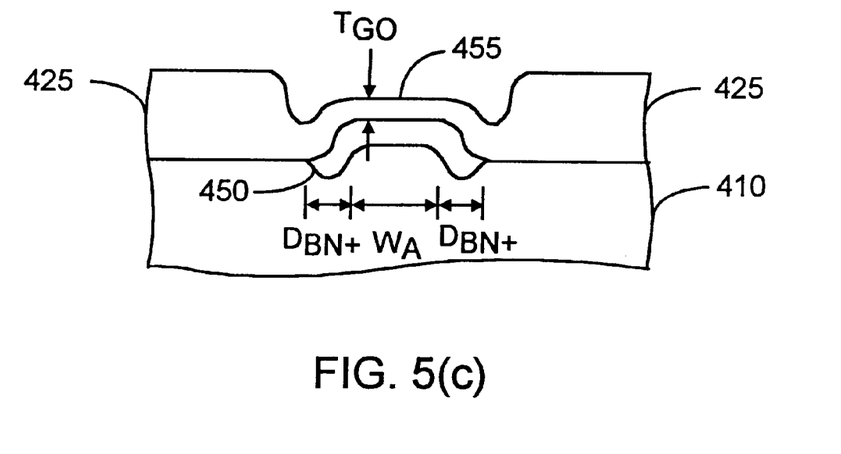

Referring to FIG. 5(c), substrate 410 is then annealed to increase the depth of BN+ diffusion layer 450 and to repair the damage caused by the ion implantation to the substrate. Annealing substrate 410 also causes BN+ diffusion layer 450 to diffuse laterally through the substrate, increasing the overlap $D_{BN+}$. The annealing may be performed by heating substrate 410 in a nonoxidizing environment.

Next, still referring to FIG. 5(c), an oxide layer 455 is formed over the exposed portion of substrate 410 in the buried diffusion region. FIG. 4 shows a plan view of oxide layer 455. Oxide layer 455 forms part of the insulating oxide for the floating gate (not shown) of memory transistor 401. In one embodiment of the present invention, oxide layer 455 is composed of SiO$_2$ and has a thickness $T_{GO}$ in the range of about 500–3000 Å. In this embodiment, oxide layer 455 is formed using thermal oxidation.

Figure 5D:
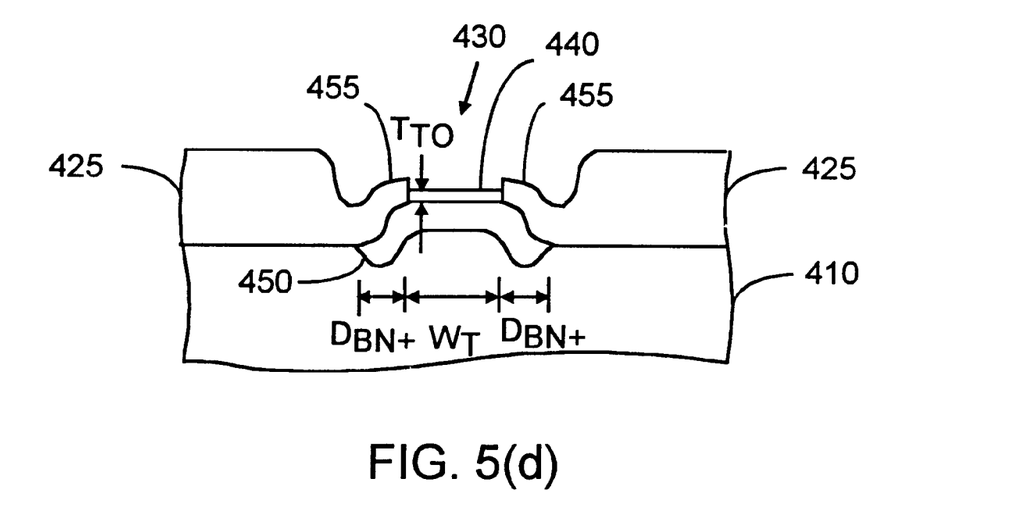

Referring to FIG. 5(d), a portion of oxide layer 455 is then removed from a tunnel window region of substrate 410 to form a tunnel window 430 having a width of $W_T$. FIG. 4 shows a plan view of tunnel window 430. The buried diffusion region (corresponding to BN+ diffusion layer 450) encloses the tunnel window region and extends beyond it by the overlap $D_{BN+}$. As a result, BN+ diffusion layer 450 extends outside the perimeter of tunnel window 430 by the overlap $D_{BN+}$. Initial active region 420 and this overlap form the final active region. The width of the final active region ensures that tunnel window 430 is fully enclosed by BN+ diffusion layer 450 despite any tunnel window misalignment that may occur during the fabrication of EEPROM cell 400. To accommodate a tunnel window misalignment of 0.15 $\mu$m, an overlap $D_{BN+}$ of about 0.2 $\mu$m is required. In one embodiment of the present invention, oxide layer 455 is removed by performing an isotropic wet etch of substrate 410 through a tunnel window mask (not shown).

Next, referring again to FIG. 5(d), a tunnel oxide layer 440 is formed over the exposed portion of substrate 410 in the tunnel window region. As mentioned earlier, tunnel oxide layer 440 is composed of a very thin oxide layer through which electrons may tunnel during an EEPROM cell program or erase operation. In one embodiment of the present invention, tunnel oxide layer 440 is composed of SiO$_2$ and has a thickness $T_{TO}$ of about 100 Å. In this embodiment, tunnel oxide layer 440 is formed using thermal oxidation.

Figure 5E:
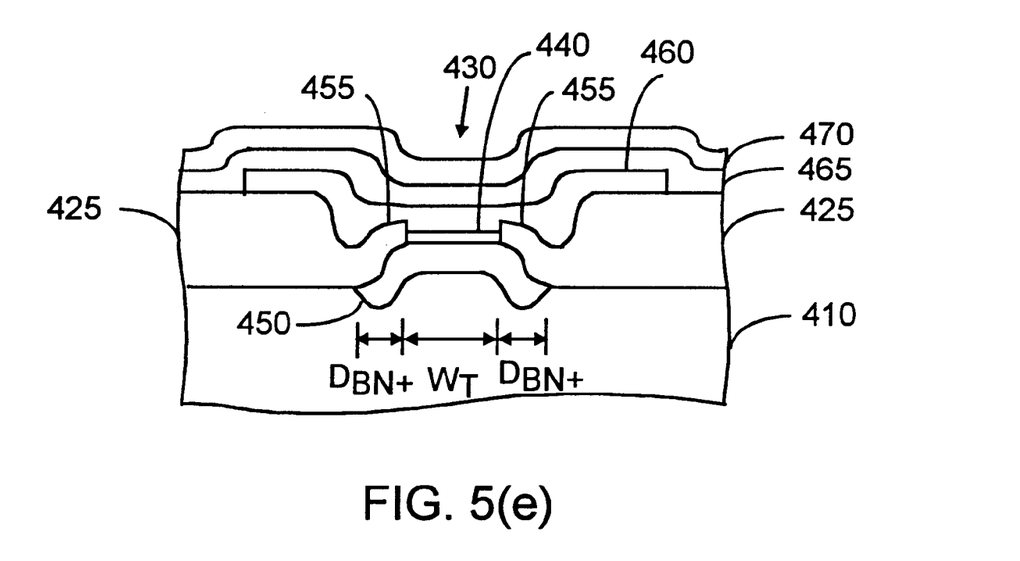

Referring to FIG. 5(e), the fabrication process for the tunnel window portion of EEPROM cell 400 is completed by depositing and patterning poly1 layer 460, an oxide-nitride-oxide (ONO) layer 465 and poly2 layer 470 over tunnel window 430. As mentioned earlier, poly1 layer 460 and poly2 layer 470 form the floating gate and control gate, respectively, of memory transistor 401.

In summary, the present invention is a method for fabricating a tunnel window that reduces or eliminates the initial active region overlap yet still compensates for tunnel window misalignment. The inventive method accomplishes this by removing a portion of the field oxide layer surrounding the initial active region before depositing the BN+ diffusion layer. This step is performed in order to enlarge the area in which the BN+ diffusion layer is formed to beyond the perimeter of the tunnel window. As a result, the method of the present invention ensures that the tunnel window is fully enclosed by the BN+ diffusion layer despite any tunnel window misalignment that may occur.

By reducing or eliminating the active region overlap, the present invention reduces the cell pitch. The poly that forms the floating gate has a width that is defined with respect to the width of the active region. This invention defines an initial and final active region. By using the narrower initial active region to define the poly, the invention reduces the cell pitch an EEPROM cell compared to a process that uses the final active region. The present invention also increases the reliability of read operations by increasing the coupling ratio.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method for fabricating a tunnel window in an EEPROM cell, comprising providing a substrate;

defining an initial active region in the substrate;

forming a field oxide layer over the substrate adjacent to and surrounding the active region;

forming and patterning a mask leaves exposed a first region of the initial active region in which a tunnel window is to be formed, as well a region of the field oxide immediately surrounding the first region;

using the mask, removing a portion of the field oxide layer adjacent the active region so as to define a buried diffusion region in the substrate;

forming a buried diffusion layer in the substrate in the buried diffusion region;

forming an oxide layer over the substrate in the buried diffusion region;

removing a portion of the oxide layer so as to define a tunnel window region, the tunnel window region enclosed by and smaller than the buried diffusion region;

forming a tunnel oxide layer over the substrate in the tunnel window region; and forming a floating gate over the oxide layer and tunnel oxide layer having a width defined with respect to a portion of the initial active region that includes the tunnel window region;

wherein the initial active region and buried diffusion region together define a final active region, and the EEPROM cell has a pitch corresponding to the width of the floating gate.

2. The method of claim 1, wherein the tunnel window region is not self-aligned with the field oxide layer, and is separated from the field oxide layer by a portion of the buried diffusion region.

3. The method of claim 1, wherein the step of forming the buried diffusion layer is followed by an annealing step to increase the depth of the buried diffusion layer and to cause the buried diffusion layer to diffuse laterally.

* * * * *